(12) United States Patent
Bleidistel et al.

(10) Patent No.: US 10,185,221 B2
(45) Date of Patent: Jan. 22, 2019

(54) ARRANGEMENT FOR ACTUATING AN ELEMENT IN A MICROLITHOGRAPHIC PROJECTION EXPOSURE APPARATUS

(71) Applicant: Carl Zeiss SMT GmbH, Oberkochen (DE)

(72) Inventors: Sascha Bleidistel, Aalen (DE); Ulrich Schoenhoff, Neu-Ulm (DE); Juergen Fischer, Heidenheim (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/830,876

(22) Filed: Dec. 4, 2017

(65) Prior Publication Data

US 2018/0181005 A1 Jun. 28, 2018

Related U.S. Application Data

(63) Continuation of application No. 15/430,086, filed on Feb. 10, 2017, now Pat. No. 9,841,682, which is a (Continued)

(30) Foreign Application Priority Data

Jan. 24, 2013 (DE) .................. 10 2013 201 082

(51) Int. Cl.
*G03F 7/20* (2006.01)
*G02B 26/08* (2006.01)
(Continued)

(52) U.S. Cl.
CPC ....... *G03F 7/70191* (2013.01); *G02B 5/0891* (2013.01); *G02B 7/181* (2013.01);
(Continued)

(58) Field of Classification Search
CPC ...... G02B 7/005; G02B 7/182; G02B 7/1822; G02B 7/1827; G02B 7/1828;
(Continued)

(56) References Cited

U.S. PATENT DOCUMENTS 4,664,487 A 5/1987 Tam
6,150,750 A 11/2000 Burov et al.
(Continued)

FOREIGN PATENT DOCUMENTS

DE 102 25 266 3/2003
DE 10 2011 075 316 A1 11/2012
(Continued)

OTHER PUBLICATIONS

German Office Action, with translation thereof, for corresponding DE Appl No. 10 2013 201 082.6, dated Sep. 19, 2013.
(Continued)

*Primary Examiner* — Colin Kreutzer
(74) *Attorney, Agent, or Firm* — Fish & Richardson P.C.

(57) ABSTRACT

The invention relates to arrangements for actuating an element in a microlithographic projection exposure apparatus. In accordance with one aspect, an arrangement for actuating an element in a microlithographic projection exposure apparatus comprises a first number ($n_R$) of degrees of freedom, wherein an adjustable force can be transmitted to the optical element in each of the degrees of freedom, and a second number ($n_A$) of actuators, which are coupled to the optical element in each case via a mechanical coupling for the purpose of transmitting force to the optical element, wherein the second number ($n_A$) is greater than the first number ($n_R$). In accordance with one aspect, at least one of the actuators is arranged in a node of at least one natural vibration mode of the optical element.

20 Claims, 8 Drawing Sheets

Related U.S. Application Data continuation of application No. 14/818,507, filed on Aug. 5, 2015, now Pat. No. 9,568,837, which is a continuation of application No. 14/311,767, filed on Jun. 23, 2014, which is a continuation of application No. 14/157,718, filed on Jan. 17, 2014, now Pat. No. 8,786,268.

(60) Provisional application No. 61/756,086, filed on Jan. 24, 2013.

(51) Int. Cl.
| | | |
|---|---|---|
| *G02B 5/08* | (2006.01) | |
| *G02B 7/18* | (2006.01) | |
| *G02B 27/00* | (2006.01) | |
| *G02B 7/00* | (2006.01) | |
| *G02B 7/185* | (2006.01) | |

(52) U.S. Cl.
CPC ..... *G02B 26/0825* (2013.01); *G02B 27/0068* (2013.01); *G03F 7/702* (2013.01); *G03F 7/709* (2013.01); *G03F 7/7015* (2013.01); *G03F 7/70233* (2013.01); *G03F 7/70266* (2013.01); *G03F 7/70308* (2013.01); *G03F 7/70825* (2013.01); *G02B 7/005* (2013.01); *G02B 7/185* (2013.01)

(58) Field of Classification Search
CPC ........ G02B 7/185–7/198; G02B 26/06; G02B 26/0825; G03F 7/20; G03F 7/70191; G03F 7/702; G03F 7/70233; G03F 7/70266; G03F 7/70825; G03F 7/709
USPC ........... 355/53, 55, 67, 71, 77; 359/846, 849
See application file for complete search history.

(56) References Cited

U.S. PATENT DOCUMENTS

| | | |
|---|---|---|
| 6,327,065 B1 | 12/2001 | Danial et al. |
| 6,330,052 B1 | 12/2001 | Yonekawa et al. |
| 6,398,373 B1 | 6/2002 | Guzman et al. |
| 6,842,277 B2 | 1/2005 | Watson |
| 7,110,089 B2 | 9/2006 | Mizuno |
| 7,304,717 B2 | 12/2007 | Hummel et al. |
| 7,486,382 B2 | 2/2009 | Back et al. |
| 7,557,903 B2 | 7/2009 | Schoormans et al. |
| 7,710,542 B2 | 5/2010 | Hummel et al. |
| 7,742,149 B2 | 6/2010 | DeVos et al. |
| 7,782,446 B2 | 8/2010 | Kamidi et al. |
| 7,859,643 B2 | 12/2010 | Asada |
| 7,961,294 B2 | 6/2011 | Hummel et al. |
| 8,625,077 B2 | 1/2014 | Ito |
| 8,786,826 B1 | 7/2014 | Bleidistel et al. |
| 9,568,837 B2 | 2/2017 | Bleidistel et al. |
| 9,841,682 B2 | 12/2017 | Bleidistel et al. |
| 2003/0197914 A1 | 10/2003 | Cox et al. |
| 2004/0017623 A1 | 1/2004 | Watson |
| 2004/0164253 A1 | 8/2004 | Ito |
| 2004/0263812 A1 | 12/2004 | Hummel et al. |
| 2005/0190462 A1 | 9/2005 | Rau et al. |
| 2005/0243298 A1 | 11/2005 | de Jager et al. |
| 2006/0164619 A1 | 7/2006 | Back et al. |
| 2007/0076310 A1 | 4/2007 | Sakino et al. |
| 2007/0132980 A1 | 6/2007 | Schoormans et al. |
| 2007/0280609 A1 | 12/2007 | Ito |
| 2007/0284502 A1 | 12/2007 | Hsin et al. |
| 2008/0100894 A1 | 5/2008 | Asada |
| 2008/0117397 A1 | 5/2008 | Weber et al. |
| 2008/0174757 A1 | 7/2008 | Hummel et al. |
| 2008/0212054 A1 | 9/2008 | Kamidi et al. |
| 2008/0246936 A1 | 10/2008 | Loopstra et al. |
| 2008/0309911 A1 | 12/2008 | Marie De Vos et al. |
| 2009/0021847 A1 | 1/2009 | Nawata |
| 2009/0040487 A1 | 2/2009 | Hummel et al. |
| 2009/0050776 A1 | 2/2009 | Muehlbeyer et al. |
| 2009/0141258 A1 | 6/2009 | Back et al. |
| 2009/0207393 A1 | 8/2009 | Butler et al. |
| 2009/0237793 A1 | 9/2009 | Koo et al. |
| 2010/0001168 A1 | 1/2010 | Saiki |
| 2010/0195085 A1 | 8/2010 | Fuse |
| 2011/0062306 A1 | 3/2011 | Heiland |
| 2011/0164230 A1 | 7/2011 | Ito |
| 2011/0199597 A1 | 8/2011 | Hummel et al. |
| 2011/0235015 A1 | 9/2011 | Dengel et al. |
| 2013/0038848 A1 | 2/2013 | Weber et al. |
| 2014/0204354 A1 | 7/2014 | Kwan et al. |
| 2014/0204356 A1 | 7/2014 | Bleidistel et al. |
| 2014/0300882 A1 | 10/2014 | Bleidistel et al. |
| 2016/0054661 A1 | 2/2016 | Bleidistel et al. |
| 2017/0153553 A1 | 6/2017 | Bleidistel et al. |

FOREIGN PATENT DOCUMENTS

| | | |
|---|---|---|
| EP | 1 385 034 | 1/2004 |
| EP | 1 965 258 B1 | 5/2011 |
| JP | 2000-121814 A | 4/2000 |
| JP | 2004-064076 | 2/2004 |
| JP | 2004-506236 | 2/2004 |
| JP | 2004-281664 | 10/2004 |
| JP | 2005-003736 | 1/2005 |
| JP | 2005-150615 A | 6/2005 |
| JP | 2007-103657 | 4/2007 |
| JP | 2007-165875 A | 6/2007 |
| JP | 2007-528125 | 10/2007 |
| JP | 2008-112756 | 5/2008 |
| JP | 2008-219001 A | 9/2008 |
| JP | 2008-300828 A | 12/2008 |
| JP | 2010-182867 A | 8/2010 |
| JP | 2011-142165 A | 7/2011 |
| JP | 2012-507160 A | 3/2012 |
| WO | WO 02/12948 | 2/2002 |
| WO | WO 2005/081060 | 9/2005 |
| WO | WO 2005/101131 | 10/2005 |
| WO | WO 2012/150215 A1 | 11/2012 |

OTHER PUBLICATIONS

M.G.E. Schneiders et al., "Benefits of over-actuation in motion systems", Proceedings of the 2004 American Control Conference (ACC 2004), Boston, Jun. 30-Jul. 2, 2004.

M.G.E. Schneiders et al., "Introduction to an Integrated Design for Motion Systems Using Over-Actuation," Proceedings of the European Control Conference 2003 (ECC2003), Sep. 1-4, 2003, Cambridge, UK, (pp. 6). Stevenage: IEE Event Services.

Japanese Office Action, with translation thereof, for JP Appl No. 2014-010360, dated Jan. 20, 2015.

Dick Antonius Hendrikus Laro, "Mechatronic Design of an Electromagnetically Levitated Linear Positioning System using Novel Multi-DoF Actuators," May 18, 2009.

Japanese Decision of Rejection, with translation thereof, for JP 2014-010360, dated Dec. 8, 2015.

Japanese Office Action, with translation thereof, for corresponding JP Appl No. 2014-010360, dated Jun. 14, 2016.

Japanese Office Action, with translation thereof, for corresponding JP Appl. No. 2016-077537, dated Dec. 6, 2016, 8 pages.

Japanese Office Action, with translation thereof, for corresponding Appl No. 2016-077537, dated Oct. 24, 2017.

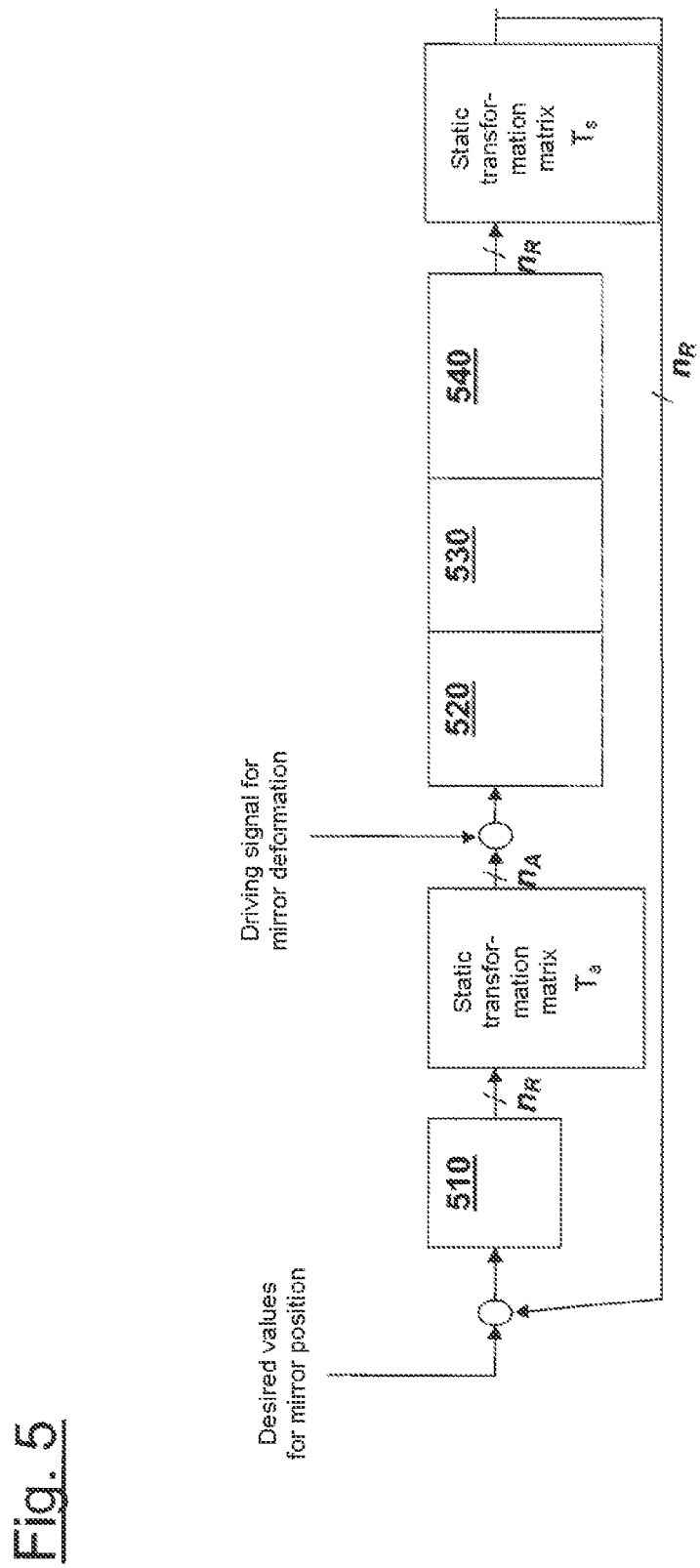

ARRANGEMENT FOR ACTUATING AN ELEMENT IN A MICROLITHOGRAPHIC PROJECTION EXPOSURE APPARATUS

CROSS-REFERENCE TO RELATED APPLICATIONS

This application is a continuation of, and claims priority under 35 USC 120 to, U.S. application Ser. No. 15/430,086, filed Feb. 10, 2017, now U.S. Pat. No. 9,841,682, which is a continuation of, and claims priority under 35 USC 120 to, U.S. application Ser. No. 14/818,507, filed Aug. 5, 2015, now U.S. Pat. No. 9,568,837, which is a continuation of, and claims priority under 35 USC 120 to, U.S. application Ser. No. 14/311,767, filed Jun. 23, 2014, now abandoned, which is a continuation of and claims priority under 35 USC 120 to U.S. application Ser. No. 14/157,718, filed Jan. 17, 2014, now U.S. Pat. No. 8,786,826, which claims priority under 35 U.S.C. § 119(e)(1) to U.S. Provisional Application No. 61/756,086 filed Jan. 24, 2013. U.S. application Ser. No. 14/311,767 and U.S. application Ser. No. 14/157,718 also claim benefit under 35 U.S.C. § 119 to German Application No. 10 2013 201 082.6, filed Jan. 24, 2013. The contents of these applications are hereby incorporated by reference in its entirety.

BACKGROUND OF THE INVENTION

Field of the Invention

The invention relates to arrangements for actuating an element in a microlithographic projection exposure apparatus.

Prior Art

Microlithography is used for producing microstructured components such as, for example, integrated circuits or LCDs. The microlithography process is carried out in a so-called projection exposure apparatus having an illumination device and a projection lens.

The image of a mask (=reticle) illuminated via the illumination device is in this case projected via the projection lens onto a substrate (e.g. a silicon wafer) coated with a light-sensitive layer (photoresist) and arranged in the image plane of the projection lens, in order to transfer the mask structure to the light-sensitive coating of the substrate.

In a projection exposure apparatus designed for EUV (i.e. for electromagnetic radiation having a wavelength of less than 15 nm), for lack of light-transmissive materials being available, mirrors are used as optical components for the imaging process. The mirrors can be fixed on a carrying frame and can be designed to be at least partly manipulatable in order to enable the respective mirror to be moved for example in six degrees of freedom (i.e. with regard to displacements in the three spatial directions x, y and z and with regard to rotations $R_x$, $R_y$ and $R_z$ about the corresponding axes). In this case, the position of the mirrors can be determined via position sensors fixed to a sensor frame.

In a projection exposure apparatus designed for EUV, mirrors designed to be manipulatable are used both as actively deformable mirrors, in the case of which changes in the optical properties that occur e.g. during the operation of the projection exposure apparatus and resultant imaging aberrations, e.g. on account of thermal influences, can be compensated for by active deformation, and as non-actively deformable mirrors, in the case of which no targeted deformation is effected.

The positional control of such mirrors serves, in conjunction with a suitable actuator system (e.g. with Lorentz actuators), to keep the mirrors in their position as stably as possible, such that a deviation of the mirror positions that is measured via the position sensors is as small as possible. One approach that is possible in principle for this purpose consists in increasing the controller gain and thus increasing the control bandwidth. In this case, however, the problem occurs in practice that the mirrors are not ideally rigid bodies, but rather each have specific natural frequencies of the mechanical structures (e.g. of a typical order of magnitude in the range of 2-3 kHz), wherein the corresponding natural frequency spectra for the dimensions of the mirrors and of the carrying and measuring structures, the dimensions increasing with increasing numerical apertures, are shifted further and further toward lower frequencies. This applies all the more to actively deformable mirrors, which have to be designed to be deformable and thus compliant in a targeted manner. An excitation of the natural frequencies via the actuators can have the effect, however, that on account of the relatively low damping in the control loop comparatively large amplitudes are detected by the respective position sensors, as a result of which the stability of the control loop can be jeopardized and active positional control can no longer be operated stably or can be operated only with low control quality.

With regard to the prior art, reference is made for example to U.S. Pat. No. 6,842,277 B2, US 2007/0284502 A1 and the publication "Benefits of over-actuation in motion systems", by M. G. E. Schneiders et al., Proceedings of the 2004 American Control Conference (ACC 2004), Boston (2004).

SUMMARY OF THE INVENTION

It is an object of the present invention to provide arrangements for actuating an element in a microlithographic projection exposure apparatus which enable active positional control of the element with higher control quality.

This object is achieved in accordance with the features of the independent patent claims.

In accordance with one aspect, the invention relates to an arrangement for actuating an element in a microlithographic projection exposure apparatus, comprising:
- a first number ($n_R$) of degrees of freedom, wherein an adjustable force can be transmitted to the optical element in each of the degrees of freedom; and
- a second number ($n_A$) of actuators, which are coupled to the optical element in each case via a mechanical coupling for the purpose of transmitting force to the optical element;
- wherein the second number ($n_A$) is greater than the first number ($n_R$); and
- wherein at least one of the actuators is arranged in a node of at least one natural vibration mode of the optical element.

The invention is based on the concept, in particular, of performing, in an arrangement for actuating an element, in particular a mirror, an "over-actuation" insofar as the number of actuators exceeds the number of degrees of freedom (that is to say for example for an actuation of the element or mirror in six degrees of freedom, at least seven actuators are used). This additional freedom with regard to the application of forces to the optical element, the additional freedom being obtained as a result of the surplus of actuators available (relative to the number of degrees of freedom) in comparison with an unambiguously statically determinate arrangement, can now be used further to the effect that the forces are applied to the optical element in such a way that the above-described excitation of natural vibrations of the mechanical structures is reduced or even completely masked out. A further advantage of this over-actuation is that a better distribution of the forces is made possible on account of the higher number of actuators.

The additional freedom obtained as a result of the over-actuation according to the invention can be used firstly during the positioning of the actuators and secondly also during the driving of the actuators (i.e. the targeted configuration of the generated line of force). As far as the positioning of the actuators is concerned, in accordance with the abovementioned approach of the invention, at least one of the actuators is arranged in a node of a natural vibration mode, which has the consequence that the respective undesired natural vibration mode is not excited, independently of the excitation of the relevant actuator.

In accordance with a further aspect, the invention relates to an arrangement for actuating an optical element in a microlithographic projection exposure apparatus, comprising
- a first number ($n_R$) of degrees of freedom, wherein an adjustable force can be transmitted to the optical element in each of the degrees of freedom; and
- a second number ($n_A$) of actuators, which are coupled to the optical element in each case via a mechanical coupling for the purpose of transmitting force to the optical element;
- wherein the second number ($n_A$) is greater than the first number ($n_R$); and
- wherein the actuators are arranged such that the actuation in the degrees of freedom is substantially orthogonal to at least one natural vibration mode of the optical element.

In accordance with the above approach, the actuators are arranged such that the actuation in the degrees of freedom is substantially orthogonal to at least one natural vibration mode. Within the meaning of the present application, "substantially" orthogonal should be understood such that the actuation of the natural vibration modes, which becomes visible in the transfer function of the open control loop as a weakly damped resonance, is reduced in terms of its magnitude compared with a non-over-actuation by at least 6 dB, in particular by at least 12 dB, more particularly by at least 20 dB.

In accordance with one embodiment, the optical element is a mirror. Even if in the further embodiments the optical element is in each case a mirror of a projection exposure apparatus designed for EUV, the invention is not restricted thereto. In this regard, the invention can also be realized in conjunction with other optical elements, such as e.g. refractive or diffractive optical elements. In further embodiments, the invention can also be realized in a projection exposure apparatus designed for DUV (i.e. for wavelengths of less than 200 nm, in particular less than 160 nm).

The mirror can be configured in particular in such a way that it is actively deformable in order to compensate for an undesirable disturbance in the projection exposure apparatus. Such a disturbance can be, for example, a thermal expansion on account of absorption of the radiation emitted by the (e.g. EUV) light source, and also imaging aberrations (caused by such thermal influences or in some other way).

For actively deforming a deformable mirror, use is typically made of a comparatively high number of (deformation) actuators (e.g. of the order of magnitude of 10-100), wherein in addition the mirror is designed to be comparatively elastic in contrast to a non-actively deformable mirror. According to the invention, these (deformation) actuators, in particular, can be used for realizing the over-actuation described above. In accordance with this approach, therefore, the deformation actuators are used doubly insofar as firstly they are used for deforming the relevant mirror and secondly they are used for controlling the position of the mirror and in this case for generating the requisite forces in such a way that undesired natural vibration modes of the mirror are excited to a lesser extent or are not excited at all. In other words, therefore, the deformation actuators additionally perform the function of the positioning actuators (exclusively present in the case of a non-actively deformable mirror).

In accordance with a further embodiment, the mirror can also be a non-actively deformable mirror.

In accordance with one embodiment, the arrangement furthermore comprises a third number ($n_S$) of sensor elements for determining the location and/or position of the optical element. In accordance with one embodiment, in this case the third number ($n_S$) of sensor elements is greater than the first number ($n_R$) of degrees of freedom.

In accordance with this aspect of the invention, in particular in conjunction with a non-actively deformable mirror, therefore, a surplus $n_S$ (i.e. at least $n_R+1$) of sensors can also be provided relative to the number of degrees of freedom ($n_R$) that exist in the positioning of the optical element. This further concept according to the invention, which is equivalent to the above-described over-actuation in terms of control engineering, is also designated as "over-sensing" hereinafter analogously to over-actuation. The additional freedom obtained as a result of the surplus of sensors can be used for choosing an arrangement of the sensors in such a way that specific natural frequencies or natural vibration modes are not even detected by the sensor system in the first place, with the consequence that the positional control cannot react to such natural frequencies. The concept of over-sensing has the further advantage that forces are still applied to the optical element or the mirror in a statically governed manner and inherent or undesired deformations of the optical element or mirror are thus avoided.

The above-described concept of "over-sensing" is also advantageous independently of the concept of "over-actuation".

In accordance with a further aspect, therefore, the invention also relates to an arrangement for actuating an optical element in a microlithographic projection exposure apparatus, comprising:
- a first number ($n_R$) of degrees of freedom, wherein an adjustable force can be transmitted to the optical element in each of the degrees of freedom; and
- a third number ($n_S$) of the sensor elements for determining the location and/or position of the optical element;
- wherein the third number ($n_S$) is greater than the first number ($n_R$).

The arrangement according to the invention can be designed, in particular, for actuating an optical element in a microlithographic projection exposure apparatus designed for EUV.

The invention can furthermore be used both in the illumination device and in the projection lens of a microlithographic projection exposure apparatus.

In accordance with one embodiment, the first number ($n_R$) of degrees of freedom is at least three, in particular six.

The invention furthermore relates to a microlithographic projection exposure apparatus comprising an arrangement having the features described above.

In accordance with a further aspect, the invention relates to a method for actuating an optical element in a microlithographic projection exposure apparatus,
wherein adjustable forces are transmitted to the optical element in a first number ($n_R$) of degrees of freedom;
wherein the force transmission is effected via a second number ($n_A$) of actuators;
wherein the second number ($n_A$) is greater than the first number ($n_R$); and
wherein at least one of the actuators is arranged in a node of at least one natural vibration mode of the optical element.

In accordance with a further aspect, the invention also relates to a method for actuating an optical element in a microlithographic projection exposure apparatus,
wherein adjustable forces are transmitted to the optical element (100, 200) in a first number ($n_R$) of degrees of freedom;
wherein the force transmission is effected via a second number ($n_A$) of actuators;
wherein the second number ($n_A$) is greater than the first number ($n_R$); and
wherein the actuation in the degrees of freedom is substantially orthogonal to at least one natural vibration mode of the optical element.

In accordance with one embodiment, the optical element is actively deformed by the adjustable forces.

In accordance with one embodiment, the position of the optical element is manipulated by the adjustable forces.

In accordance with one embodiment, a third number ($n_S$) of sensor elements are used to determine the location and/or position of the optical element. In this case, in particular, the third number ($n_S$) can be greater than the first number ($n_R$).

The invention therefore also relates to a method for positioning and/or actively deforming an optical element in a microlithographic projection exposure apparatus,
wherein a controllable force is transmitted to the optical element in a first number ($n_R$) of degrees of freedom; and
wherein a third number ($n_S$) of sensor elements are used to determine the location and/or position of the optical element;
wherein the third number ($n_S$) is greater than the first number ($n_R$).

In this case, the method can respectively comprise in particular the following steps:
determining at least one imaging aberration in the projection exposure apparatus; and
positioning and/or actively deforming the optical element in such a way that the imaging aberration is at least partly compensated for.

Further configurations of the invention can be gathered from the description and the dependent claims.

The invention is explained in greater detail below on the basis of exemplary embodiments illustrated in the accompanying figures.

BRIEF DESCRIPTION OF THE DRAWINGS

In the figures:

FIG. 5 shows a diagram for elucidating a control loop on the basis of the example of an actively deformable mirror with realization of the over-actuation according to the invention;

DETAILED DESCRIPTION OF PREFERRED EMBODIMENTS

Figure 1A:
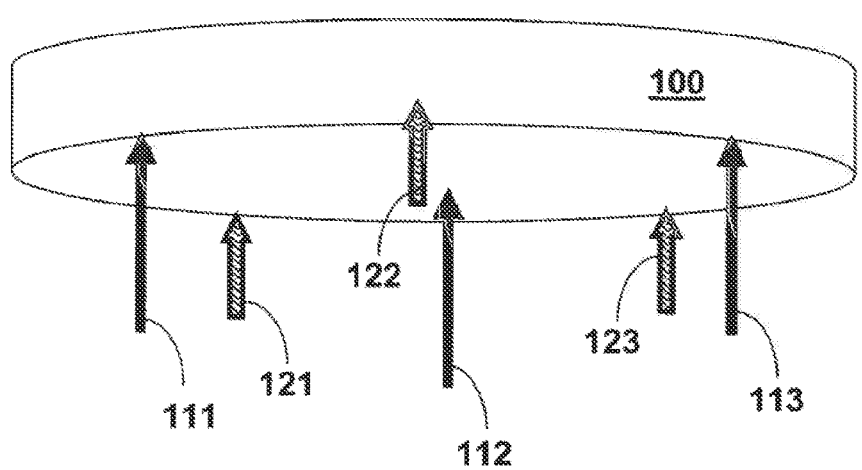
FIGS. 1A-1B show schematic illustrations for elucidating one approach according to the invention in conjunction with a non-actively deformable mirror.
Figure 1B:
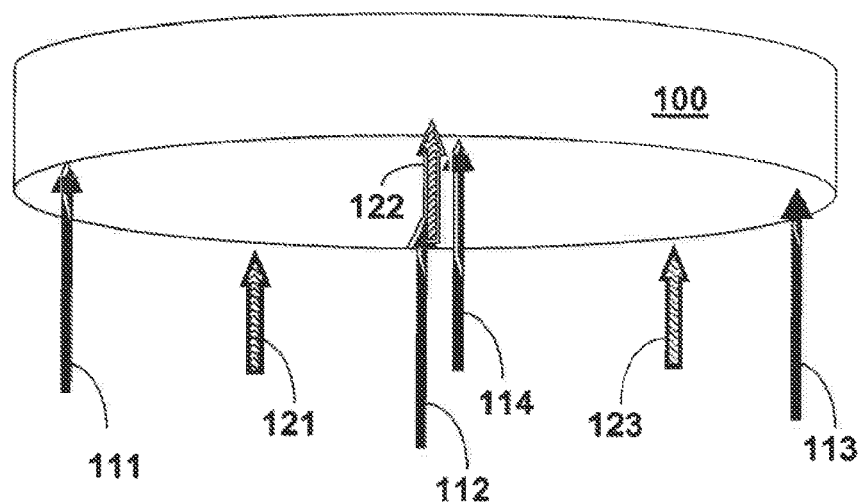

FIGS. 1A-1B firstly show schematic illustrations for elucidating one approach according to the invention in conjunction with a non-actively deformable mirror.

In accordance with FIG. 1A, a mirror 100 to be held in a defined position is conventionally mounted isostatically by virtue of the fact that three actuators 111, 112 and 113 having a force direction or drive direction perpendicular to the mirror 100 are used to position the mirror 100 in the three degrees of freedom z, $R_x$ and $R_y$ (i.e. with regard to displacement in the spatial direction z and rotation about the x- and y-axis, respectively). With exactly these three actuators 111, 112 and 113, the three degrees of freedom z, $R_x$ and $R_y$ are statically determinate. As likewise explained here with reference to FIGS. 3 and 4, however, these three actuators 111, 112 and 113 can excite elastic natural frequencies or natural vibration modes of the mirror 100.

Figure 3:
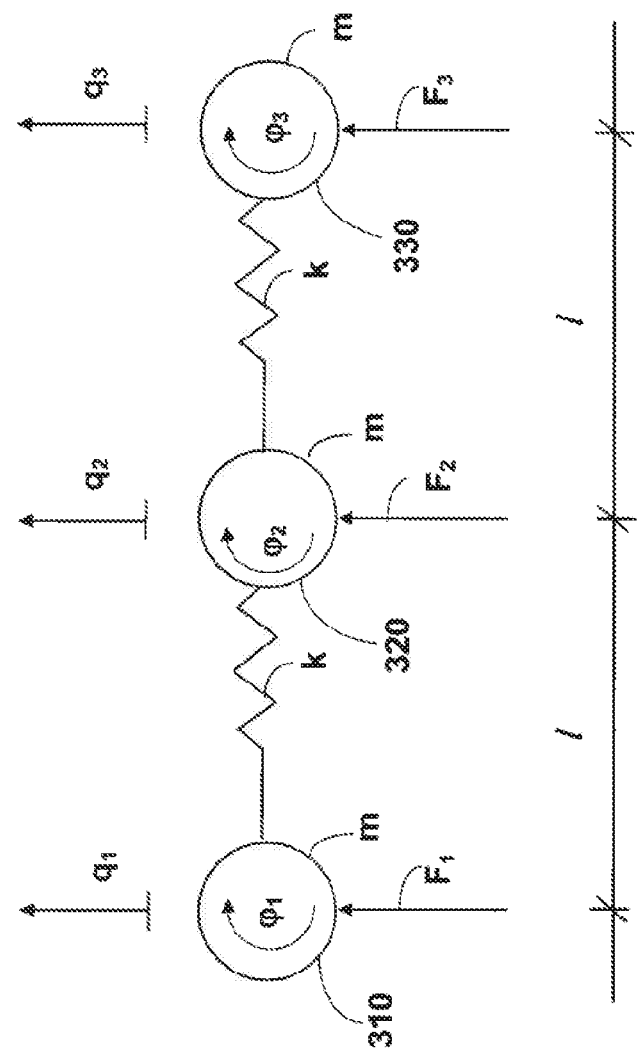
FIGS. 3-4A-4C show schematic illustrations for elucidating one embodiment on the basis of the example of positional control of a vibratory body.

As indicated in FIG. 1B, a higher number (in the example $n_A=4$) of actuators 111, 112, 113 and 114 relative to the number of degrees of freedom (in the example the three degrees of freedom z, $R_x$ and $R_y$) is now used according to the invention, as likewise explained in even greater detail with reference to FIGS. 3 and 4, the actuators 111-114 being positioned in such a way that no undesired excitation or associated disturbance of the positional control takes place for some natural frequencies or natural vibration modes of the mirror 100.

Figure 2:
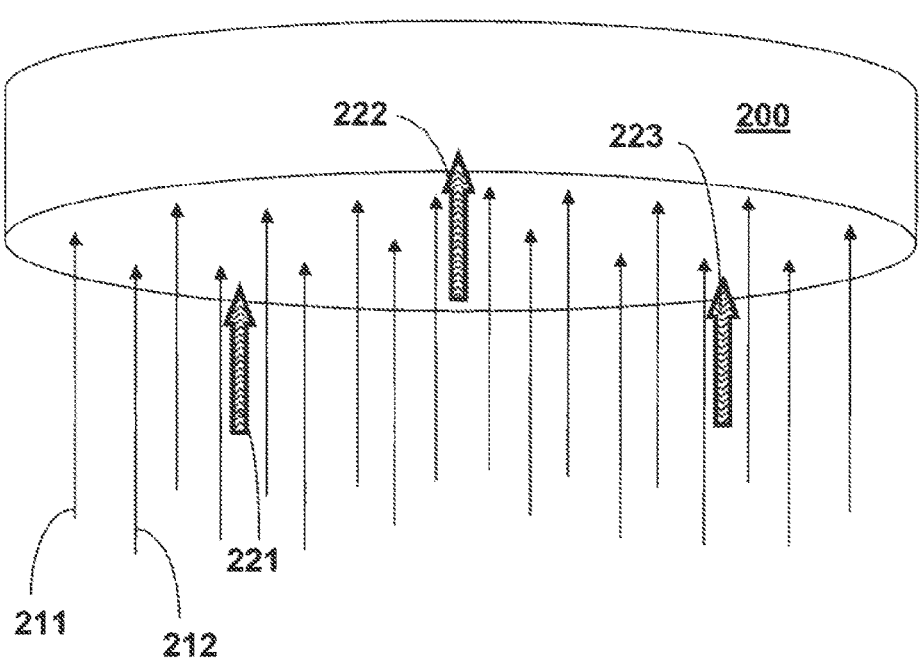
FIG. 2 shows a schematic illustration for elucidating one approach according to the invention in conjunction with an actively deformable mirror.

FIG. 2 serves for clarifying the concept according to the invention in conjunction with an actively deformable mirror 200, likewise merely indicated schematically. In accordance with FIG. 2, a comparatively high number (e.g. 10, 100 or more) of deformation actuators 211, 212, . . . serve for actively deforming the deformable mirror 200, wherein the mirror 200 is simultaneously designed to be comparatively elastic in order to enable an active deformation. According to the invention, the deformation actuators 211, 212, . . . are used doubly insofar as firstly they serve for deforming the mirror 200 and secondly they serve, by way of the over-actuation described above, to configure the positional control of the mirror 200 in such a way that an undesired excitation of natural frequencies or natural frequency modes of the mirror 200 as far as possible does not occur.

The principle and the functioning of the over-actuation applied according to the invention to an optical element such as a mirror, for example, are explained below on the basis of a specific exemplary embodiment with reference to the schematic illustrates in FIGS. 3 and 4. In this case, the movement of the optical element in FIGS. 3 and 4 is restricted to a translational and a rotational degree of freedom, for the sake of simplicity, and the system is subdivided or discretized into three nodes 310, 320, 330 for describing the vibration capability, wherein each of the nodes 310, 320, 330 has a respective translational degree of freedom $q_1$, $q_2$ and $q_3$ and a respective rotational degree of freedom $\varphi_1$, $\varphi_2$ and $\varphi_3$.

Furthermore, in accordance with FIG. 3, the same mass m is assigned to each node 310, 320, 330, wherein the nodes 310, 320, 330 are associated with the same stiffness k.

Figure 4A:
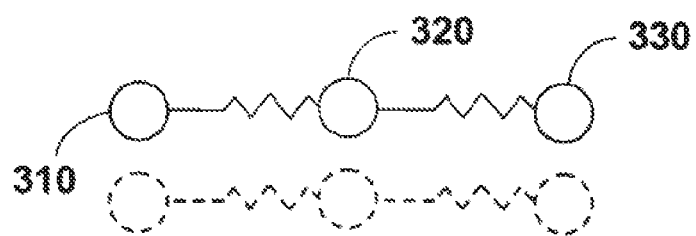
Figure 4B:
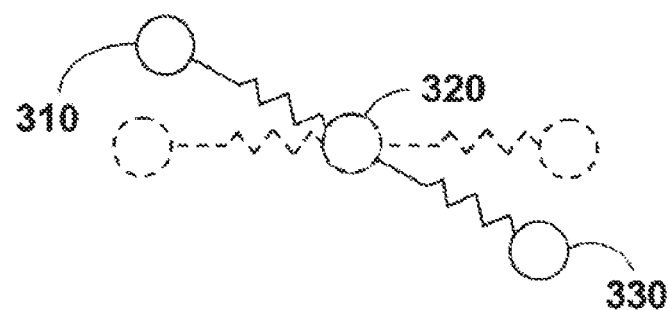
Figure 4C:
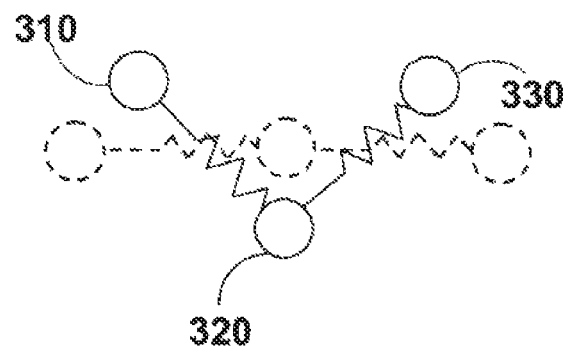

The system discretized in a simplified manner in accordance with FIG. 3 shows, as illustrated schematically in FIGS. 4A-4C, three vibration modes, wherein a first vibration mode is the translation of the rigid body (FIG. 4A), a second vibration mode is the rotation of the rigid body (FIG. 4B) and a third vibration mode is a first bending vibration of the rigid body (FIG. 4C).

$$\begin{pmatrix} q_1 \\ q_2 \\ q_3 \end{pmatrix} = \begin{pmatrix} 1 \\ 1 \\ 1 \end{pmatrix} = q_{m1} \tag{1}$$

$$\begin{pmatrix} q_1 \\ q_2 \\ q_3 \end{pmatrix} = \begin{pmatrix} +1 \\ 0 \\ -1 \end{pmatrix} = q_{m2} \tag{2}$$

$$\begin{pmatrix} q_1 \\ q_2 \\ q_3 \end{pmatrix} = \begin{pmatrix} +1 \\ -1 \\ +1 \end{pmatrix} = q_{m3} \tag{3}$$

Conventionally, two actuators could then be chosen for a statically determinate actuation, via which actuators the rigid-body translation and the rigid-body rotation can be actuated, for which purpose, in the specific case, one actuator (for applying the force $F_1$) can be arranged at the node 310 and the other actuator (for applying the force $F_3$) can be arranged at the node 330. For the control of the translation and respectively rotation by a controller, a transformation matrix $T_a$ can usually be used which generates a desired translational force f and a desired torque M, via these two actuators:

$$\begin{pmatrix} f_1 \\ f_2 \\ f_3 \end{pmatrix} = T_a \begin{pmatrix} f \\ M \end{pmatrix}, \tag{4}$$

$$\text{where } T_a = \begin{pmatrix} \frac{1}{2} & \frac{1}{2l} \\ 0 & 0 \\ \frac{1}{2} & \frac{1}{2l} \end{pmatrix}$$

wherein the following holds true:

$$q_{m1}^T \cdot T_a = (1 \quad 0), \tag{5}$$

$$q_{m2}^T \cdot T_a = \left(0 \quad \frac{1}{l}\right),$$

$$q_{m3}^T \cdot T_a = (1 \quad 0)$$

Upon checking how the vibration modes of the system are excited in the case of such a statically determinate actuation via the chosen actuators and using the abovementioned transformation matrix, it is then evident that the force f excites the translational rigid-body mode (mode 1) as desired and the torque M excites the rotational rigid-bodied mode (mode 2), but the force f also additionally excites the bending mode (mode 3) (since, as can be seen from (5), the bending mode (=mode 3) is visible in the translational axis). Consequently, the bending mode is also visible in the transfer function of the control loop for the translational movement and may possibly lead undesirably to a limitation of the bandwidth that can be set.

The problem described above can now be rectified via the over-actuation according to the invention as follows. For this purpose, an additional actuator is provided in the exemplary embodiment, the additional actuator being arranged at the node 320 for applying the force $F_2$ in accordance with FIG. 3. Consequently, three actuators are available for generating the forces for translation and rotation, such that compared with the above-described statically determinate actuation via two actuators, additional freedom is obtained with regard to the design of the transformation matrix Ta, since the transformation matrix Ta is now no longer uniquely determinate. In order to use the freedom additionally obtained as a result, the elements of the transformation matrix Ta are preferably chosen such that the force f and the torque M still actuate only the corresponding (translational or rotational) rigid-body degree of freedom, but the force f can no longer excite the bending mode.

In the specific exemplary embodiment, the transformation matrix Ta can be chosen as follows:

$$\begin{pmatrix} f_1 \\ f_2 \\ f_3 \end{pmatrix} = T_a \begin{pmatrix} f \\ M \end{pmatrix}, \tag{6}$$

$$\text{where } T_a = \begin{pmatrix} \frac{1}{3} & \frac{1}{2l} \\ \frac{1}{3} & 0 \\ \frac{1}{3} & \frac{1}{2l} \end{pmatrix}$$

wherein the following holds true:

$$q_{m1}^T \cdot T_a = (1 \quad 0), \tag{7}$$

$$q_{m2}^T \cdot T_a = \left(0 \quad \frac{1}{l}\right),$$

$$q_{m3}^T \cdot T_a = (0 \quad 0)$$

As can be seen from (7), the bending mode (=mode 3) is no longer visible in the translational axis.

FIG. 5 shows a diagram for elucidating the construction and function of a control loop for the case of an actively deformable mirror with the realization of the above-explained concept of over-actuation according to the invention. In this case, $n_R$ denotes the number of positionally controlled rigid-body degrees of freedom and $n_A$ denotes the number of positionally controlled actuators, wherein the number of actuators exceeds the number of degrees of freedom, that is to say $n_A > n_R$ holds true.

In accordance with FIG. 5, the desired values for the mirror position are fed to a position controller 510, which generates a static transformation matrix $T_a$ for the $n_R$ positionally controlled rigid-body degrees of freedom. On the basis of the transformation matrix $T_a$ and a driving signal for the mirror deformation, actuators 520 for actuating the mirror 530 are driven with position determination via the position sensors 540. The resultant static transformation matrix $T_a$ is in turn fed to the position controller 510, etc.

Figure 6:
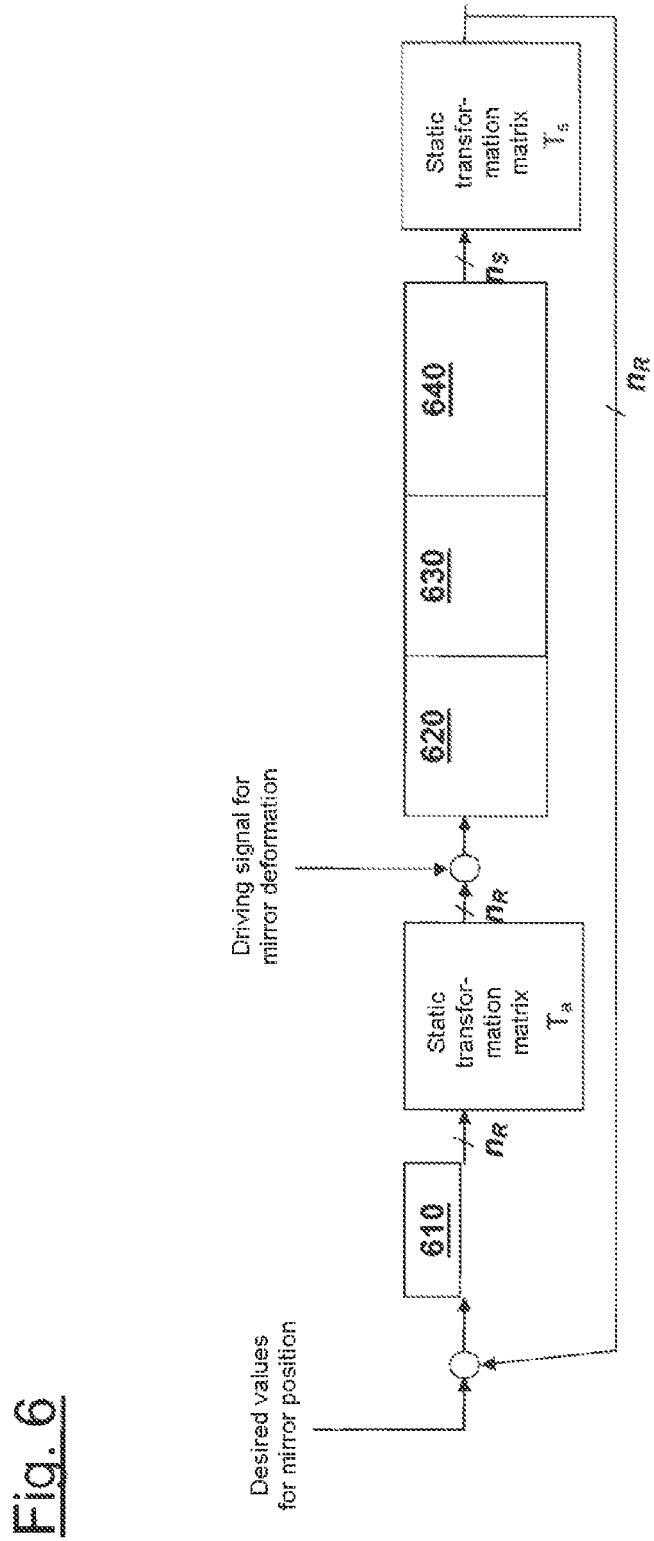
FIG. 6 shows a diagram for elucidating a control loop on the basis of the example of an actively deformable mirror with realization of the over-sensing according to the invention.

FIG. 6 shows an analogous diagram for elucidating a control loop for the case of an actively deformable mirror with the realization of the concept of "over-sensing" according to the invention, likewise explained above. In this case, $n_R$ denotes the number of positionally controlled rigid-body degrees of freedom and $n_S$ denotes the number of sensors, wherein the number of sensors exceeds the number of degrees of freedom; $n_S > n_R$ holds true.

Figure 7:
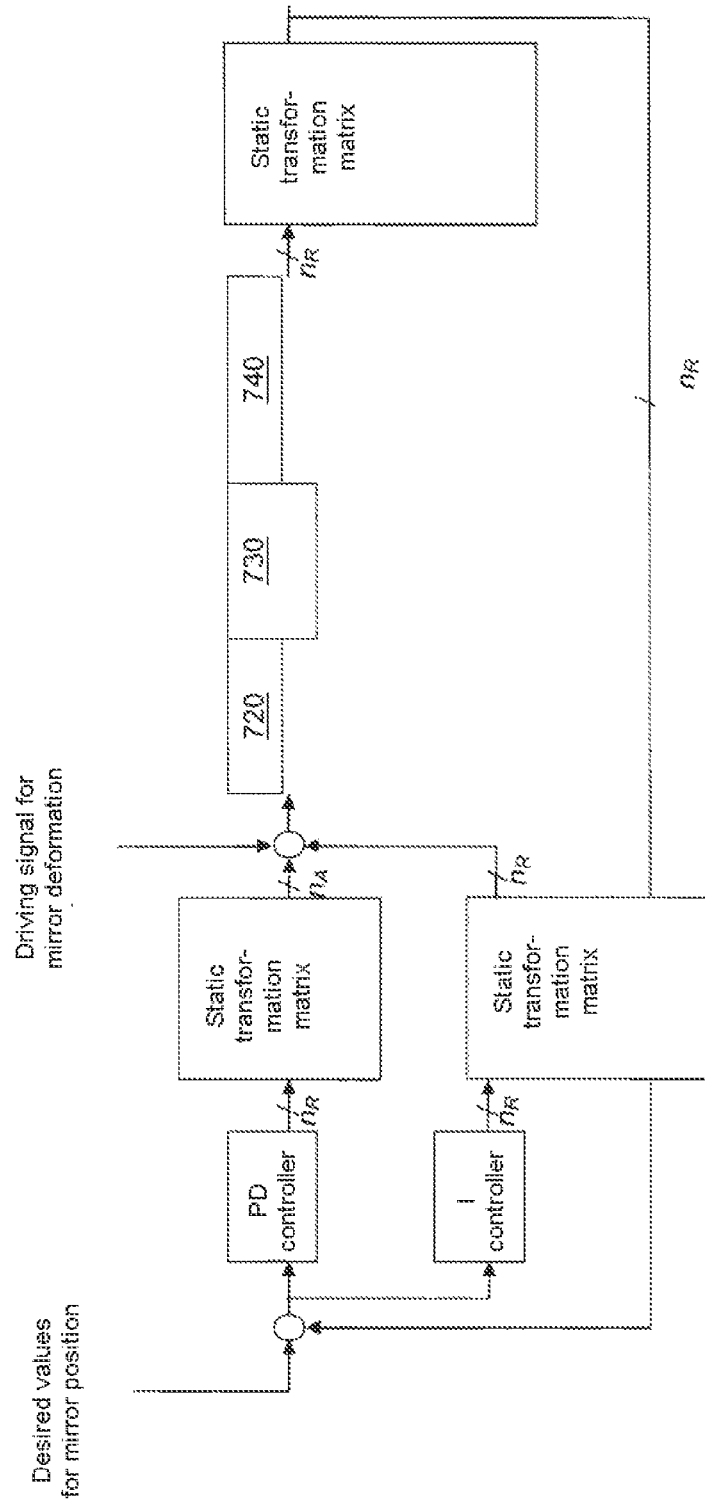
FIG. 7 shows a diagram for elucidating a control loop on the basis of the example of an actively deformable mirror with realization of a statically determinate I-controller.

FIG. 7 shows a further exemplary embodiment of the invention, wherein components that are analogous or substantially functionally identical to FIG. 5 are designated by reference numerals increased by "200". In this case, once again $n_R$ denotes the number of positionally controlled rigid-body degrees of freedom and $n_A$ denotes the number of positionally controlled actuators, wherein the following holds true: $n_A > n_R$.

The exemplary embodiment in FIG. 7 takes account of the circumstance that the over-actuation applied according to the invention can lead to undesired deformations of the optical element. The cause of the undesired deformations is that the position controller generally exerts both dynamic and small static forces in order to keep the optical element stably in position. The static forces can be position- and time-dependent. The overdeterminate application of the variable static forces to an overdeterminate number of force application points (actuators) can then lead to undesired deformations of the optical element.

This problem can be solved as follows by the concept described with reference to FIG. 7: The position controller is typically a PID-like controller, i.e. a controller whose dynamic behavior has a proportional component (P component), a derivative component (D component) and an integral component (I component). The I component generates the static forces, whereas the P component and the D component generate the dynamic forces. If the I component is then separated from the PD component and applied statically determinately to a smaller statically determinate subset ($n_R$) of actuators, the static forces are always applied statically determinately to a statically determinate number of force application points, with the result that the undesired deformations described above are avoided.

Figure 8:
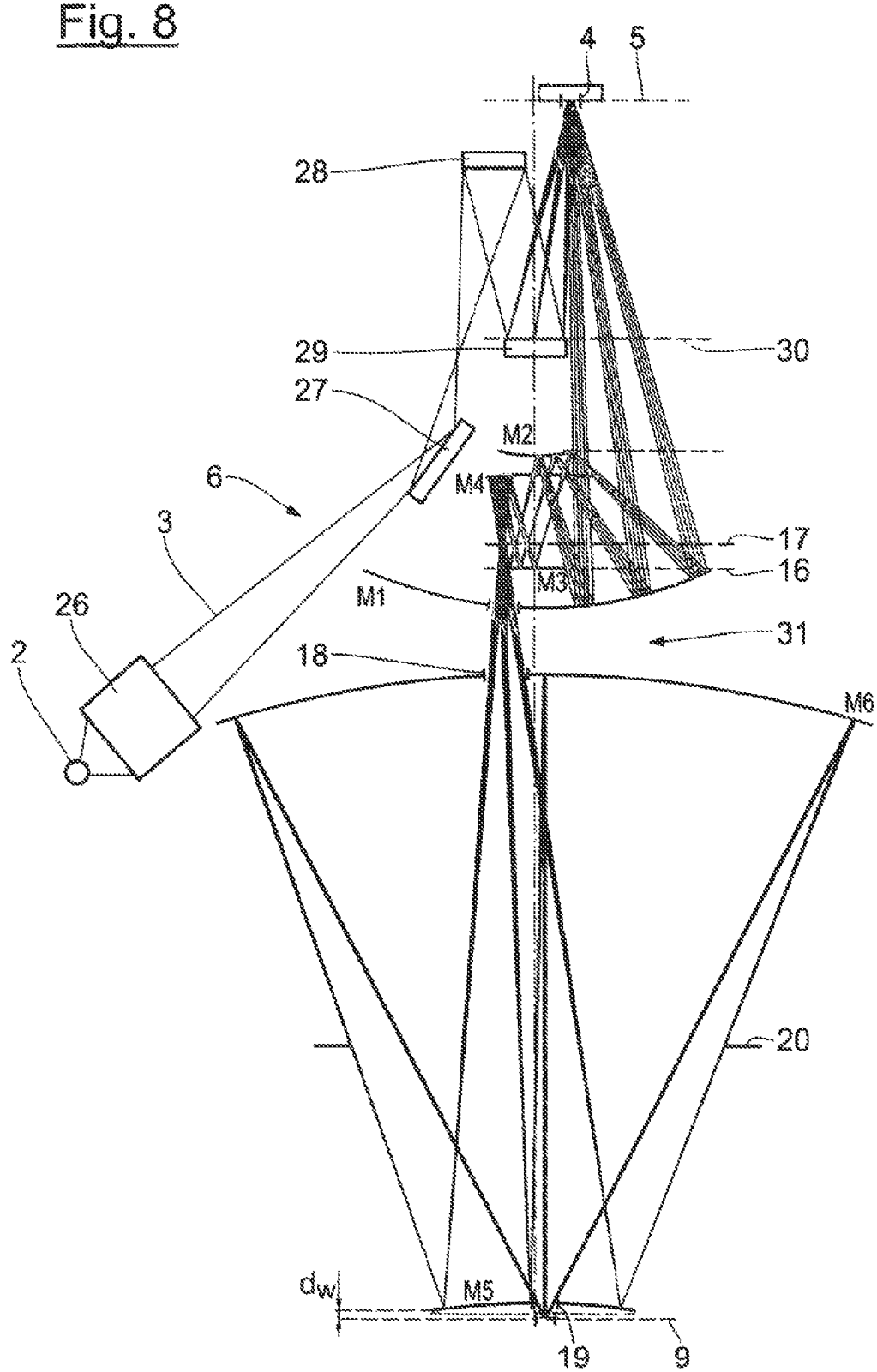
FIG. 8 shows a schematic illustration of an exemplary construction of a microlithographic projection exposure apparatus which is designed for operation in the EUV and in which the present invention can be realized.

FIG. 8 shows a schematic illustration of a microlithographic projection exposure apparatus which is designed for operation in the EUV and in which the present invention can be realized, for example.

The projection exposure apparatus in accordance with FIG. 8 comprises an illumination device 6 and a projection lens 31. The illumination device 6 comprises, in the light propagation direction of the illumination light 3 emitted by a light source 2, a collector 26, a spectral filter 27, a field facet mirror 28 and a pupil facet mirror 29, from which the light impinges on an object field 4 arranged in an object plane 5. The light emerging from the object field 4 enters into the projection lens 31 with an entrance pupil 30. The projection lens 31 has an intermediate image plane 17, a first pupil plane 16 and a further pupil plane with a stop 20 arranged therein. The projection lens 31 comprises a total of 6 mirrors M1-M6. M6 denotes the last mirror relative to the optical beam path, the mirror having a through-hole 18. M5 denotes the penultimate mirror relative to the optical beam path, the mirror having a through-hole 19. A beam emerging from the object field 4 or reticle arranged in the object plane passes onto a wafer, arranged in the image plane 9, after reflection at the mirrors M1-M6 in order to generate an image of the reticle structure to be imaged.

The arrangement according to the invention can be used for positioning and/or actively deforming one or a plurality of mirrors in the projection lens 31 and/or in the illumination device 6.

Even though the invention has been described on the basis of specific embodiments, numerous variations and alternative embodiments are evident to a person skilled in the art, e.g. via combination and/or exchange of features of individual embodiments. Accordingly, it goes without saying for a person skilled in the art that such variations and alternative embodiments are concomitantly encompassed by the present invention, and the scope of the invention is restricted only within the meaning of the accompanying patent claims and the equivalents thereof.

The invention claimed is:

1. An arrangement configured to actuate an optical element of a microlithographic projection exposure apparatus, the optical element configured so that an adjustable force is transmittable to the optical element in a first number of degrees of freedom, the arrangement comprising:
    a second number of actuators;
    wherein:
        the second number is greater than the first number;
        for each of the second number of actuators, the actuator is coupled to the optical element via a mechanical coupling to transmit force to the optical element;
        the actuators are arranged so that, when at least one natural vibration mode of the optical element is actuated, a magnitude of a transfer function of an open control loop at a frequency of the at least one natural vibration mode is reduced by at least six dB compared with an arrangement in which the second number is not greater than the first number.

2. The arrangement of claim 1, wherein the actuators are arranged so that, when the at least one natural vibration mode of the optical element is actuated, the magnitude of the transfer function of the open control loop at the frequency of the at least one natural vibration mode is reduced by at least 12 dB compared with the arrangement in which the second number is not greater than the first number.

3. The arrangement of claim 1, wherein the actuators are arranged so that, when the at least one natural vibration mode of the optical element is actuated, the magnitude of the transfer function of the open control loop at the frequency of the at least one natural vibration mode is reduced by at least 20 dB compared with the arrangement in which the second number is not greater than the first number.

4. The arrangement of claim 1, wherein the optical element comprises a mirror.

5. The arrangement of claim 4, wherein the mirror is actively deformable to compensate for an undesirable disturbance in the microlithographic projection exposure apparatus.

6. The arrangement of claim 4, wherein the mirror is a non-actively deformable mirror.

7. The arrangement of claim 1, further comprising a third number of sensor elements configured to determine at least one parameter selected from the group consisting of a location of the optical element and a position of the optical element.

8. The arrangement of claim 7, wherein the third number is greater than the first number.

9. The arrangement of claim 1, wherein at least one actuator comprises a Lorentz actuator.

10. The arrangement of claim 1, wherein the first number of degrees of freedom is at least three.

11. The arrangement of claim 1, wherein the first number of degrees of freedom is six.

12. The arrangement of claim 1, wherein the arrangement is configured so that the optical element is actively deformed by the adjustable forces.

13. The arrangement of claim 1, wherein the arrangement is configured so that a position of the optical element is manipulated via the adjustable forces.

14. The arrangement of claim 1, wherein the microlithographic projection exposure apparatus comprises an EUV microlithographic projection exposure apparatus.

15. An apparatus, comprising:
an optical element; and
an arrangement configured to actuate the optical element, the optical element configured so that an adjustable force is transmittable to the optical element in a first number of degrees of freedom, the arrangement comprising a second number of actuators;
wherein:
the second number is greater than the first number;
for each of the second number of actuators, the actuator is coupled to the optical element via a mechanical coupling to transmit force to the optical element;
the actuators are arranged so that, when at least one natural vibration mode of the optical element is actuated, a magnitude of a transfer function of an open control loop at a frequency of the at least one natural vibration mode is reduced by at least six dB compared with an arrangement in which the second number is not greater than the first number; and
the apparatus is a microlithographic projection exposure apparatus.

16. The apparatus of claim 15, comprising an illumination device, wherein the optical element is in the illumination device.

17. The apparatus of claim 15, comprising a projection lens, wherein the optical element is in the projection lens.

18. The apparatus of claim 15, wherein the optical element comprises a mirror.

19. An apparatus, comprising:
an illumination device;
a projection lens;
a mirror; and
an arrangement configured to actuate the mirror, the mirror configured so that an adjustable force is transmittable to the mirror in a first number of degrees of freedom, the arrangement comprising a second number of actuators;
wherein:
the second number is greater than the first number;
for each of the second number of actuators, the actuator is coupled to the mirror via a mechanical coupling to transmit force to the mirror;
the actuators are arranged so that, when at least one natural vibration mode of the mirror is actuated, a magnitude of a transfer function of an open control loop at a frequency of the at least one natural vibration mode is reduced by at least six dB compared with an arrangement in which the second number is not greater than the first number;
the mirror is in the illumination system or the projection lens; and
the apparatus is a microlithographic projection exposure apparatus.

20. The apparatus of claim 19, wherein the microlithographic projection exposure apparatus comprises an EUV microlithographic projection exposure apparatus.

* * * * *